US008457323B2

(12) United States Patent
Palmestål

(10) Patent No.: US 8,457,323 B2
(45) Date of Patent: Jun. 4, 2013

(54) DEVICE FOR ENTERTAINMENT DURING DRIVING OF A CAR

(76) Inventor: Kenneth Palmestål, Västra Frölunda (SE)

( * ) Notice: Subject to any disclaimer, the term of this patent is extended or adjusted under 35 U.S.C. 154(b) by 396 days.

(21) Appl. No.: 12/734,338

(22) PCT Filed: Oct. 31, 2008

(86) PCT No.: PCT/IB2008/054542

§ 371 (c)(1),
(2), (4) Date: Apr. 26, 2010

(87) PCT Pub. No.: WO2009/057078

PCT Pub. Date: May 7, 2009

(65) Prior Publication Data

US 2010/0246843 A1 Sep. 30, 2010

(30) Foreign Application Priority Data

Nov. 2, 2007 (SE) ....................................... 0702423

(51) Int. Cl.
*H03G 3/00* (2006.01)

(52) U.S. Cl.
USPC ............................. 381/61; 381/86; 340/384.3

(58) Field of Classification Search
USPC ... 381/61, 86, 71.4; 340/384.3, 441; 224/544; 439/577, 668, 669
See application file for complete search history.

(56) References Cited

U.S. PATENT DOCUMENTS

| | | | | |
|---|---|---|---|---|
| 5,237,617 | A * | 8/1993 | Miller | 381/61 |
| 5,635,903 | A * | 6/1997 | Koike et al. | 340/441 |
| 5,705,992 | A * | 1/1998 | Romano | 340/692 |
| 5,820,442 | A | 10/1998 | Helder | |
| 5,835,605 | A * | 11/1998 | Kunimoto | 381/61 |
| 6,275,590 | B1 | 8/2001 | Prus | |
| 6,356,185 | B1 * | 3/2002 | Plugge et al. | 340/384.3 |
| 7,203,321 | B1 * | 4/2007 | Freymann et al. | 381/61 |
| 7,400,859 | B2 * | 7/2008 | Dayan | 455/41.2 |
| 7,595,719 | B2 * | 9/2009 | Chen | 340/426.24 |
| 7,787,633 | B2 * | 8/2010 | Costello et al. | 381/61 |
| 7,808,370 | B2 * | 10/2010 | Tischer | 340/384.1 |
| 2003/0026439 | A1 * | 2/2003 | Yamamoto | 381/86 |
| 2006/0074645 | A1 | 4/2006 | Tischer | |
| 2006/0100771 | A1 | 5/2006 | Chen | |

FOREIGN PATENT DOCUMENTS

| | | |
|---|---|---|
| DE | 201 18 954 | 2/2002 |
| GB | 2 351 634 | 1/2001 |
| GB | 2 354 872 | 4/2001 |

OTHER PUBLICATIONS

International Search Report, Filed Apr. 26, 2010.

* cited by examiner

*Primary Examiner* — Xu Mei
(74) *Attorney, Agent, or Firm* — Harness, Dickey & Pierce, P.L.C.

(57) ABSTRACT

A device designed to be plugged into an electric socket in a vehicle, which socket constitutes part of the electrical system of the vehicle, which device, without any other connection, is able to detect the engine speed of the vehicle and convert this information to sound signals. In at least one embodiment, the device includes at least one device for detecting electrical pulses resulting from the engine speed that are unintentionally emitted from the generator, electric motor or ignition system of the vehicle, in order to record the current engine speed. Further, in at least one embodiment, the device transmits, by way of radio waves, sampled/simulated or synthetically generated noise signals based on the electrical pulses to the radio receiver/sound system of the vehicle in order to play these in or around the vehicle.

13 Claims, 1 Drawing Sheet

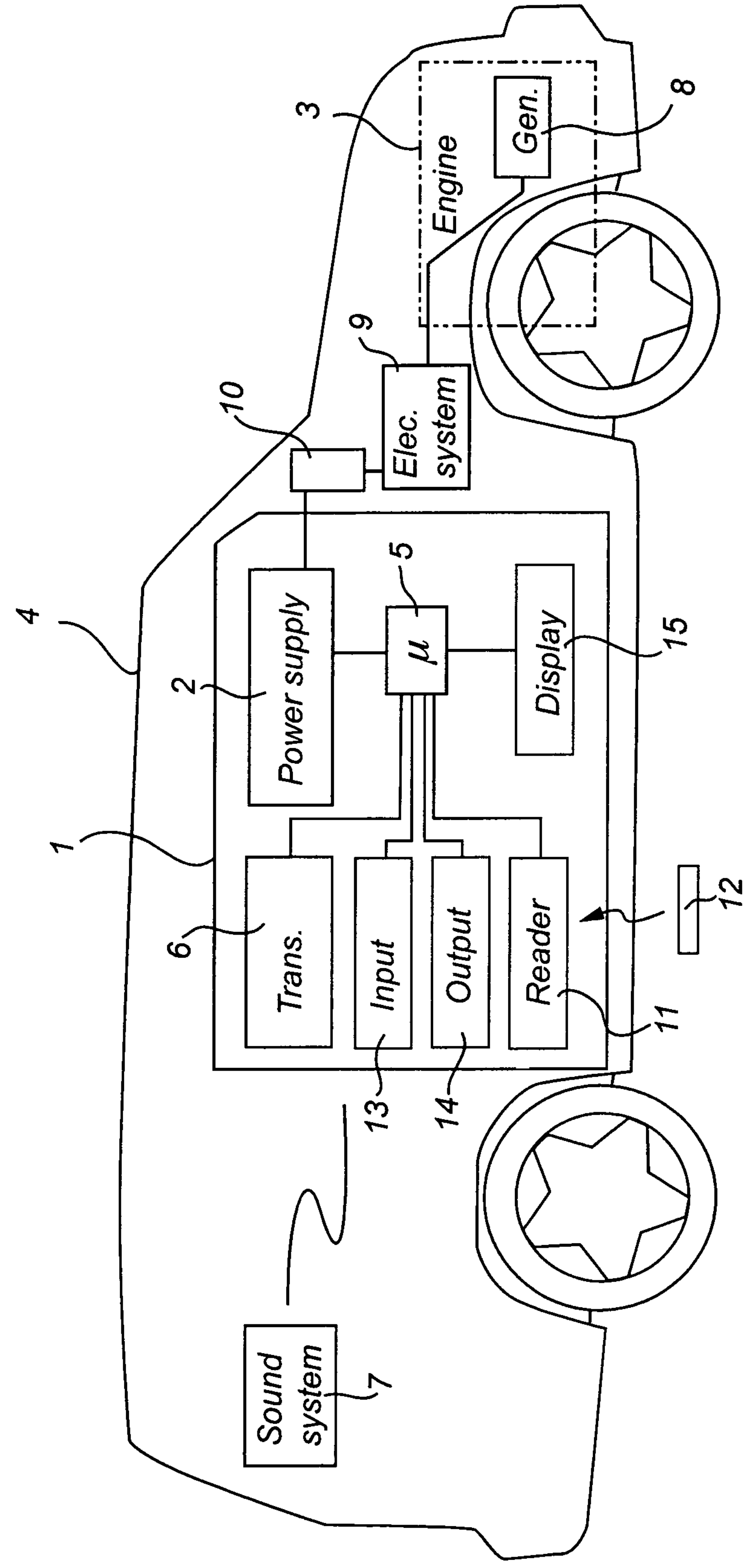
3
Engine
Gen.
8
9
Elec. system
10
4
5
μ
2
Power supply
Display
15
1
Trans.
Input
Output
Reader
6
12
11
13
14
Sound system
7

DEVICE FOR ENTERTAINMENT DURING DRIVING OF A CAR

TECHNICAL FIELD

The present invention relates to a device for generating and reproducing noise, preferably vehicle noise, in a motor vehicle.

Most modern cars are built to be as quiet as possible both for those who travel in the car and for the environment. Electric cars now being developed will completely lack all noise from the engine for natural reasons. People, who want to experience the more sporting driving experience which a genuine engine noise gives, are compelled to purchase cars which consume much more energy and are much more impractical than the normal car. Other sound effects can be used, for example, for entertaining children by arranging for the car to sound like different animals.

Electronically generated engine noise has existed for a long time and is used in toys, for example. There are also previous inventions that are based on the function of generating and reproducing vehicle noise in a motor vehicle, e.g. U.S. Pat. Nos. 5,820,442 and 20 U.S. Pat. No. 6,275,590. However, these inventions are designed so that mechanical and electrical installation work in the vehicle is required, which is considered by the average user of a device of this kind to be inconvenient and risky.

One object of the present invention is therefore to bring about a device for entertainment of the type mentioned above that is achievable and is able to create a realistic sound experience without requiring a fixed installation in the vehicle.

According to the invention the device is designed so that in a first version it only needs to be installed in an electrical socket in the vehicle, e.g. the cigarette lighter socket, or so that in another version it only needs to be installed on the instrument panel or other suitable location in the vehicle to emit a highly realistic sound curtain.

BRIEF DESCRIPTION OF THE DRAWINGS

The present invention will be described in more detail with reference to the appended drawing (FIG. 1), showing a currently preferred embodiment of the invention.

DETAILED DESCRIPTION

According to the invention the device 1 comprises at least one sensor 2 which detects the speed of the engine 3 and/or the speed variation of the vehicle 4, together with a digital signal processor 5 which converts the signal from the sensor to a signal which simulates typical noises from a motor vehicle, for example engine noise from the intake manifold and exhaust pipe, transmission and tire noise from a well known sports car. The signal processor 5 adapts the different sounds so that they realistically reflect the different phases of the propulsion of the vehicle 4, for example by producing louder engine noises during acceleration. The device also includes a radio transmitter 6 which transmits the sound signal to the vehicle sound system 7, The device may also include supplementary functions such as the connection for a memory card and sound signal input to enable transmission of music, for example, to the vehicle sound system, either as an alternative to the vehicle noises or in combination with them.

To ensure that the driving experience is the best possible, the noise generated must be realistically synchronized with the speed of the engine and the movements of the car. This is according to the present invention achieved in several different ways to fit different types of vehicles and meet various stringent demands for realism.

The following alternative methods of detecting the speed of the engine, which are new in relation to previous inventions in the field, are incorporated in the invention.

Alternative 1. Electric pulses from the generator 8 or ignition system are transmitted to the electrical system 9 of the vehicle 4, and in the version of the invention which is powered by being installed in the cigarette lighter socket 10 of the vehicle the pulses are detected in the power supply of the invention and are transmitted from there to the signal processor 5.

Alternative 2 (not shown). Electromagnetic waves from the vehicle generator or ignition system are collected by an antenna of the device according to the invention and transmitted to the signal processor.

Alternative 3 (not shown). Vibrations in the vehicle are collected by a sensor in the invention and converted to electric pulses which are transmitted to the signal processor.

In alternatives 1-3 the signal processor incorporates a calculation algorithm which filters off pulses other than those that have the engine speed as a source. The algorithm is based on the fact that the speed of an engine does not vary suddenly but continuously and with a certain inertia. This means that the pulses that indicate the speed come regularly and that the time between two pulses deviates only by a small degree from the previous time. In cases where the signal processor cannot calculate a given speed from the incoming pulses, e.g. signals that derive from the generator, the algorithm takes the lowest pulse frequency that is unchanged over a certain time, e.g. a few seconds, and uses it as a benchmark for normal idling speed, i.e. 800-1000 rpm. The algorithm takes the following as a basis. An engine whose speed increases linearly from 1000 rpm to 5000 rpm in two seconds has a speed increase at 100 rpm amounting to 120 rpm/engine revolution, which results in a reduction in the time be—20 tween pulses of 12%. This means that fault pulses that come within 78% of the time between two pulses at the previous engine revolution can be filtered off by the program. At 5000 rpm the speed increase is 24 rpm/engine revolution, which results in a reduction in the time between pulses of 2.4%. This means that fault pulses that come within 97% of the time between two pulses at the previous engine speed can be filtered off by the program.

Alternative 4 (not shown). The speed variations of the vehicle are recorded by a sensor in the invention and are converted by a microprocessor to the calculated speed, which is in turn converted to electric pulses transmitted to the signal processor. The sensor may 30 be a component, e.g. an accelerometer whose reading is recalculated to speed variations in the signal processor, or a GPS receiver which displays the value continuously for the current vehicle speed.

The invention easily simulates the noise from different types of vehicles, extending from a two-cylinder, low speed motor cycle engine to a 12-cylinder high speed sports car engine. To achieve this, the signal processor changes both the speed produced 5 and the number of cylinders by adding or subtracting pulses. The 4 cylinders of the most common car engine can therefore be caused to simulate 12 cylinders by adding two pulses between the incoming pulses. Further pulses can be added to simulate the fact that in a performance car the engine can be driven at a higher speed than the engine in a standard car, e.g. 9000 rpm instead of 6000 rpm.

The simulation/synthesizing of the sound is based not only on the speed of the vehicle and engine but also on different phases in handling the vehicle, such as starting of the engine, idling when stationary, acceleration, engine braking, even speed, shifting up and down the gears, cornering and braking.

When the invention receives the first pulses which indicate starting of the engine, the signal processor emits the mechanical noises which a starter motor produces. At an even engine speed in the range 500 to 1000 rpm's an idling sound is replicated. When the speed then increases, both the intake and exhaust noise grows louder, as do mechanical noises from the transmission. At an even speed the noises grow quieter, and in engine braking the character of the noise changes further because the intake noise is damped and the exhaust noise becomes irregular. In an alternative version the invention may also be provided with a sensor which detects the changes in movement that occur following powerful acceleration, vigorous cornering and braking, and transmits a corresponding signal to the signal processor, which then emits a sound in the form of tire noise.

The invention may also have a functionality which causes the sounds to be played without any link to the movements of the vehicle if the user so chooses, for example noises that are similar to that of a racing car on a race track.

The invention may be fitted with memory card readers 11 so that it can be provided with new sound patterns, e.g. from new car models. The memory cards 12 may also contain music files which can then be played at the same time as the engine noises. The invention may also have a line input 13 for the connection of external music players. The user can then select, with a control, the ratio of the sound volume for music to vehicle noise, and can also completely disconnect one or other sound.

The invention may have a function that automatically increases the volume level of the music to keep pace with the engine speed in order to counteract the disturbing noises from the vehicle that are generated in the form of wind noise and tire noise.

The invention may have sound patterns from different vehicles stored so that the user 10 can select the desired vehicle noise by means of a control.

The invention may have a signal output 14 for connecting headphones. One advantage of this function may be that drivers who want to protect themselves from tiring noise and roaring during long journeys can listen to the music by using headphones with active noise damping, but may also have a certain level of engine noise so that the they can hear when it is time to change gears, for example.

The invention may also be provided with a digital display 15 or screen for displaying the set transmission frequency, sound pattern selected, music played, etc.

The invention may have a function for transmitting RDS data so that the digital display on the car radio shows which sound pattern has been set or what music is being played. This function can be used to reduce the need for a digital display on the device itself.

The invention may also be combined with a GPS navigator.

The invention may have a function for detecting patterns of movement of the vehicle indicating that the driver is dosing off and transmitting a loud sound signal to warn the driver. It must be possible to load the function and the movement patterns into the invention from previously mentioned memory cards to allow updating when improved algorithms have been developed to indicate dosing off.

The invention may result in less environmental pollution (cleantech) by reducing the demand for gas-guzzling high power cars if the driving experience can be simulated with a fuel economic car or even with electric cars.

The invention claimed is:

1. Device to be plugged into an electric socket in a vehicle, the socket constituting a part of an electrical system of the vehicle, the device comprising:

a sensor to detect, without any other connection than the electrical socket, an engine speed of the vehicle from electrical pulses unintentionally emitted from a generator, electric motor or ignition system of the vehicle, and a signal processor to convert the detected engine speed to sound signals, said signal processor, being configured to identify regular speed-generated pulses, filtering off sudden pulses other than pulses that have the engine speed as a source, and, in cases when the signal processor cannot calculate a given speed from the incoming pulses, taking a lowest pulse frequency that is unchanged over a certain time, and use the lowest pulse frequency as a benchmark for normal idling speed.

2. Device according to claim 1, further comprising a radio transmitter to transmit sampled, simulated or synthetically generated noise signals based on the electrical pulses to a radio receiver or sound system of the vehicle in order to play the sampled, simulated or synthetically generated noise signals in or around the vehicle.

3. The device according to claim 1, wherein the device makes use of information regarding the engine speed to indicate whether a gear shift up or down is taking place.

4. The device according to claim 1, further comprising:

means for adding or subtracting pulses to the pulses recorded to stimulate, by signal processing, the sound pattern and speed range of different engine types.

5. The device according to claim 1, wherein the device, during different phases in handling the vehicle, provides the possibility of emitting noise signals either sampled/simulated by way of the device or synthetically produced signals on the basis of the different phases.

6. The device according to claim 1, further comprising:

a memory card reader for introducing new programs, noise data and music files.

7. The device according to claim 1, further comprising:

a line input for the connection of external music players.

8. The device according to claim 1, further comprising:

a signal output for the connection of headphones.

9. The device according to claim 1, wherein the device is configured to transmit RDS data, wherein the digital display of a radio receiver thereby can indicate the sound pattern that is set or what music is being played.

10. The device according to claim 1, wherein the device is configured to detect patterns of movement of the vehicle that indicate that the driver is dosing off to sleep and during such circumstances emits a loud noise signal to warn the driver.

11. The device according to claim 5, wherein the different phases in handling the vehicle include starting the engine, idling when stationary, acceleration, engine braking, even speed, shifting up and down, cornering and braking.

12. The device according to claim 1, wherein the certain time is a few seconds.

13. A device to be plugged into an electric socket in a vehicle, the socket constituting a part of an electrical system of the vehicle, the device, without any other connection, being able to detect an engine speed of the vehicle and to convert this information to sound signals, the device comprising:

a device sensor to detect electrical pulses resulting from the engine speed that are unintentionally emitted from a generator, electric motor or ignition system of the vehicle, in order to record a current engine speed;

a signal processor to sample, simulate or synthetically generate noise signals based on the detected electrical pulses, and a radio transmitter to transmit via radio waves, said noise signals to a radio receiver or sound system of the vehicle in order to play the sampled, simulated or synthetically generated noise signals in or around the vehicle.

* * * * *